(12) United States Patent
Lu et al.

(10) Patent No.: US 10,470,332 B1
(45) Date of Patent: Nov. 5, 2019

(54) SERVER CABINET

(71) Applicant: HONGFUJIN PRECISION ELECTRONICS (TIANJIN) CO., LTD., Tianjin (CN)

(72) Inventors: Hsueh-Chin Lu, New Taipei (TW); Kuo-Chih Hung, New Taipei (TW); Hung-Liang Chung, New Taipei (TW); Chih-Feng Chang, Tu-Cheng (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/258,955

(22) Filed: Jan. 28, 2019

(30) Foreign Application Priority Data

Dec. 20, 2018 (CN) .......................... 2018 1 1563522

(51) Int. Cl.
*H05K 7/14* (2006.01)
*H05K 5/03* (2006.01)
*H05K 5/02* (2006.01)

(52) U.S. Cl.
CPC ......... *H05K 7/1488* (2013.01); *H05K 5/0239* (2013.01); *H05K 5/03* (2013.01); *H05K 7/1401* (2013.01); *H05K 7/1417* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,635,020 | B2 * | 12/2009 | Hartel ................... | H02B 1/565 165/157 |
| 8,405,984 | B2 * | 3/2013 | Donowho .......... | H05K 7/20572 312/236 |
| 8,416,565 | B1 * | 4/2013 | Ross .................... | H05K 7/1492 248/551 |
| 8,441,788 | B2 * | 5/2013 | Xu ......................... | G06F 1/181 361/679.46 |
| 8,534,775 | B1 * | 9/2013 | Liang .................. | H05K 7/1489 312/223.1 |
| 8,605,442 | B2 * | 12/2013 | Wu ...................... | H05K 7/1489 211/26 |
| 8,616,382 | B2 * | 12/2013 | Liang .................. | H05K 7/1488 211/26 |
| 8,625,288 | B1 * | 1/2014 | Liu .............................. | 361/724 |
| 8,848,378 | B2 * | 9/2014 | Liao ........................ | G06F 1/181 248/224.8 |
| 8,925,739 | B2 * | 1/2015 | Crippen ............... | H05K 7/1488 211/26 |
| 8,971,036 | B1 * | 3/2015 | Lau .......................... | G06F 1/20 361/679.34 |
| 9,635,937 | B2 * | 5/2017 | Shen .................... | H05K 7/1488 |
| 10,172,453 | B1 * | 1/2019 | Redfern ................ | A47B 47/00 |
| 2002/0101721 | A1 * | 8/2002 | Blood .................. | H05K 7/1489 361/724 |

(Continued)

*Primary Examiner* — Lisa Lea-Edmonds
(74) *Attorney, Agent, or Firm* — ScienBiziP, P.C.

(57) ABSTRACT

A server cabinet includes a base plate, a number of sidewalls, a top plate, and a number of reinforcing ribs. The sidewalls are arranged surrounding the base plate and coupled between the top plate and the base plate to form a cavity. A portion of the sidewalls defines a number of receiving grooves. The reinforcing ribs are received within the receiving grooves and coupled to at least one of the sidewalls and the base plate.

10 Claims, 4 Drawing Sheets

(56) References Cited

U.S. PATENT DOCUMENTS

| | | | |
|---|---|---|---|
| 2010/0226083 A1* | 9/2010 | Wang | H05K 7/1489 361/679.02 |
| 2012/0013236 A1* | 1/2012 | Fan | H05K 7/1488 312/351.1 |
| 2012/0155034 A1* | 6/2012 | Hsiao | H05K 7/1489 361/726 |
| 2013/0335907 A1* | 12/2013 | Shaw | G06F 1/183 361/679.31 |
| 2016/0205812 A1* | 7/2016 | Curtin | H05K 7/20736 361/679.46 |

\* cited by examiner

SERVER CABINET

FIELD

The subject matter herein generally relates to server cabinets, and more particularly to a server cabinet having enhanced stability.

BACKGROUND

Server cabinets are generally rectangular parallelepiped structures. The server cabinet needs to have high rigidity and strength to protect electronic equipment stored within the server cabinet. Referring to FIG. 1, a server cabinet 200 of the prior art includes a beam 201 with a plurality of plate-like structures, and each beam 201 connects two opposite sidewalls 205 of a main structure 203 for stability enhancement. However, the beam 201 occupies space within the server cabinet 200.

BRIEF DESCRIPTION OF THE DRAWINGS

Implementations of the present disclosure will now be described by way of embodiments, with reference to the attached figures.

DETAILED DESCRIPTION

Figure 1:
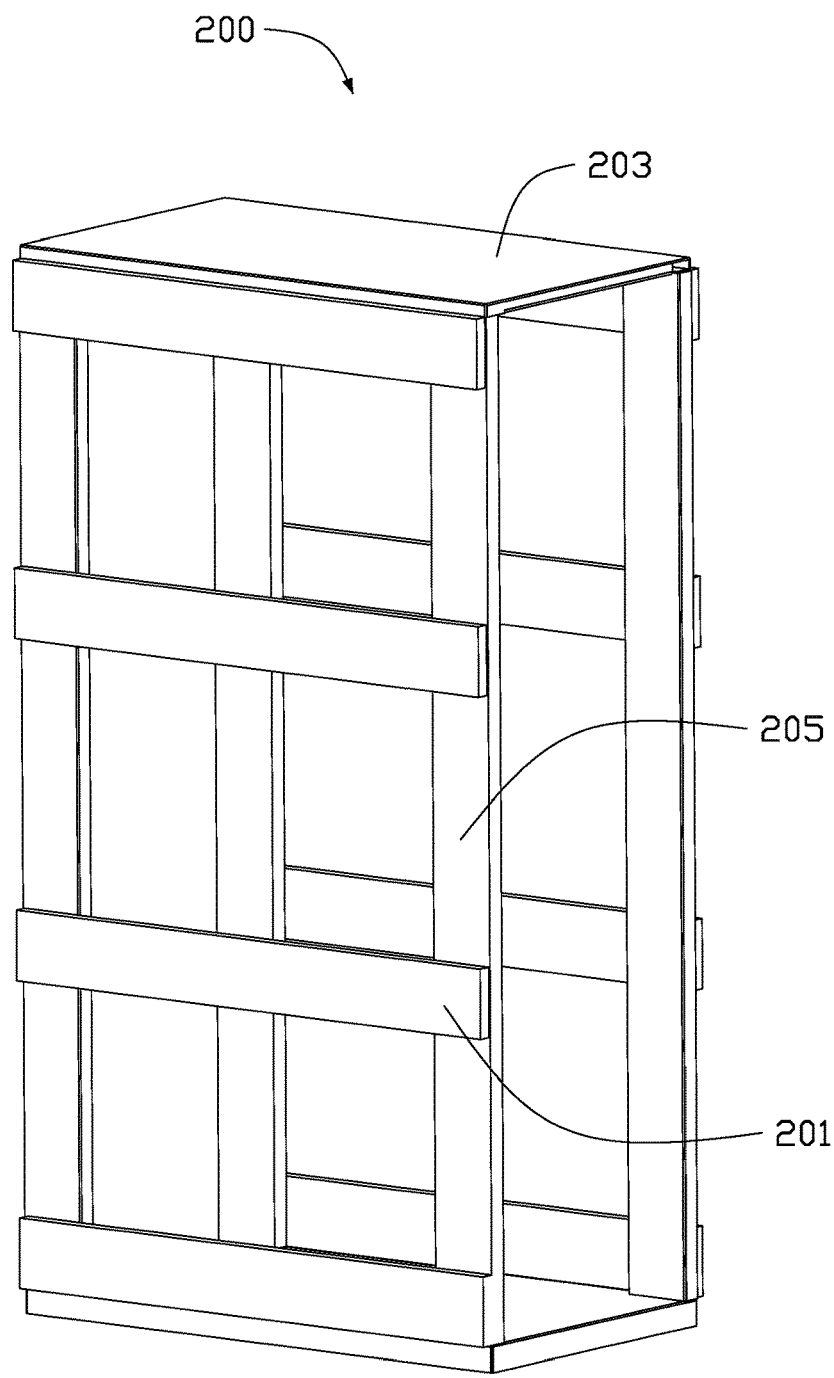
FIG. 1 is an isometric view of a server cabinet of the prior art.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
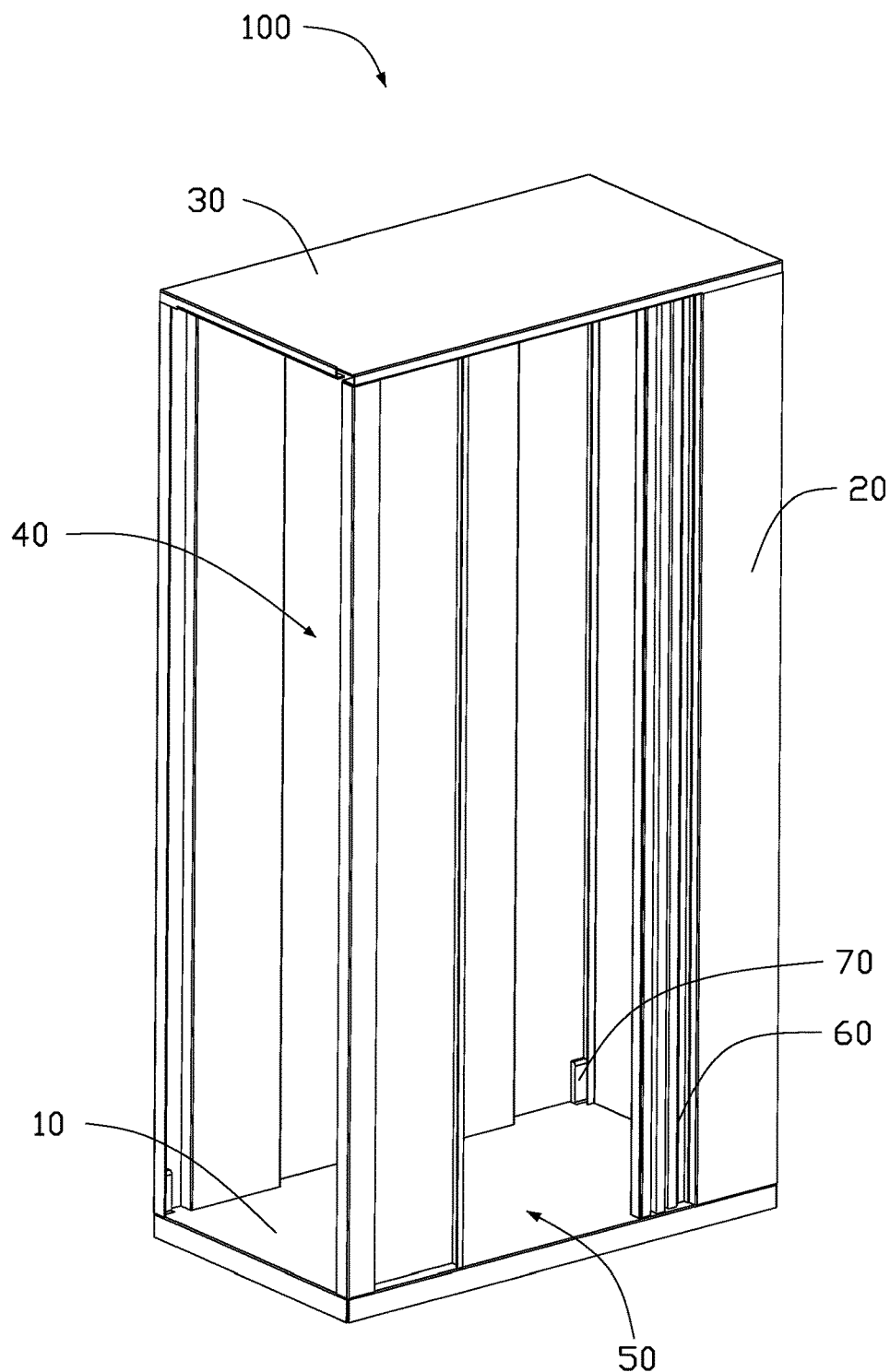
FIG. 2 is an isometric view of an embodiment of a server cabinet.

As shown in FIG. 2, a server cabinet 100 includes a base plate 10, a plurality of sidewalls 20, a top plate 30, and a plurality of reinforcing ribs 60, 70. The plurality of sidewalls 20 are arranged around the base plate 10 and are coupled between the base plate 10 and the top plate 30 to form a cavity 40. The cavity 40 receives a plurality of servers (not shown). In one embodiment, the sidewalls 20 are spaced apart around the base plate 10 and the top plate 30 to define a plurality of openings 50 to allow electronic components of the servers to be loaded into the cavity 40. The plurality of reinforcing ribs 60, 70 strengthen and improve a stability of the server cabinet 100.

Figure 3:
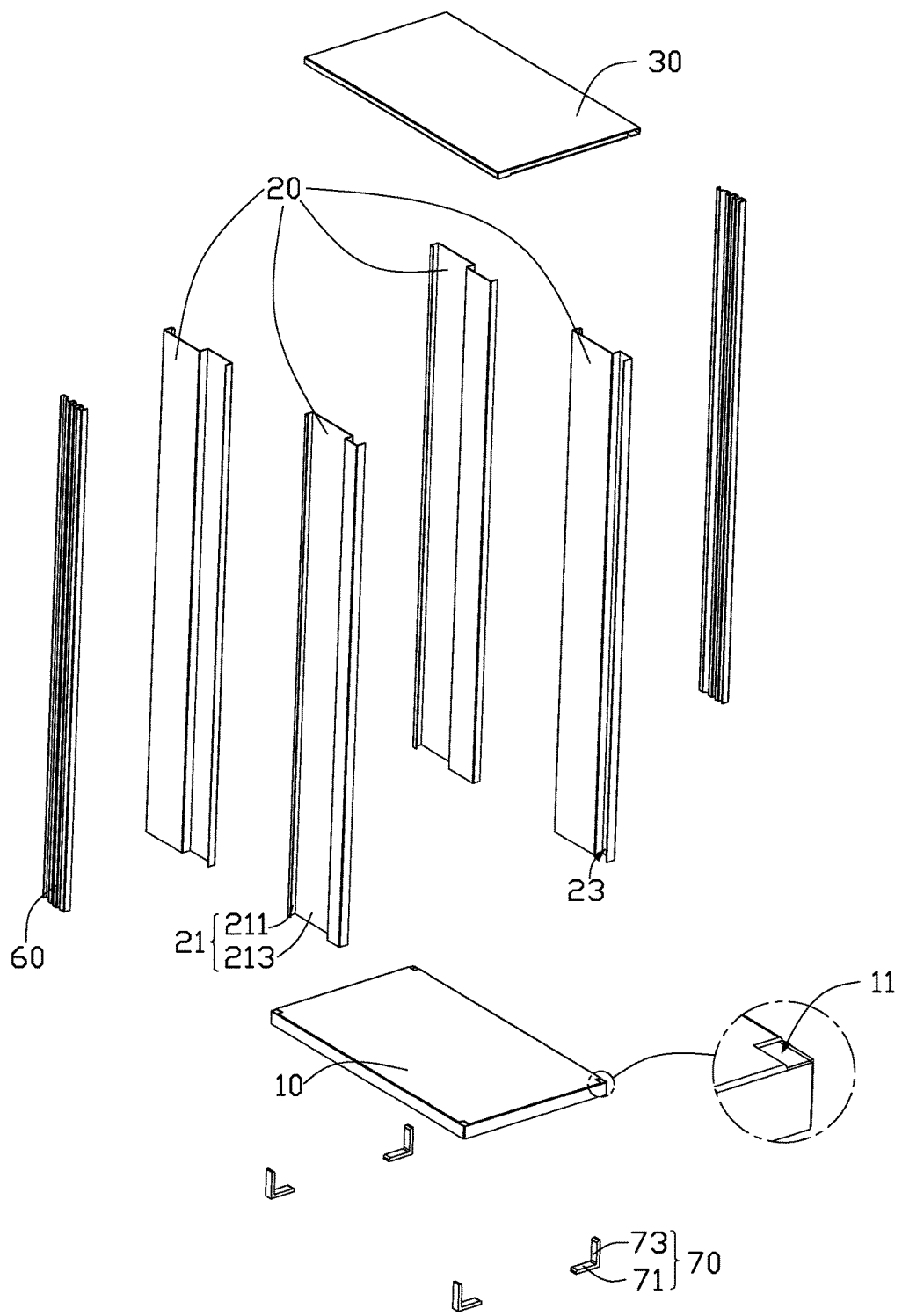
FIG. 3 is an exploded view of the server cabinet in FIG. 2.

As shown in FIG. 2 and FIG. 3, in the reinforcing ribs 60, 70 include first reinforcing ribs 60 and second reinforcing ribs 70 of different configurations. In one embodiment, the first reinforcing ribs 60 are arranged on the sidewalls 20 and abut the base plate 10 and the top plate 30. Each of the second reinforcing ribs 70 is arranged at a junction of the base plate 10 and the sidewalls 20 and coupled to the base plate 10 and the sidewalls 20. In one embodiment, a quantity of the second reinforcing ribs 70 is four, and the second reinforcing ribs 70 are respectively located at four corners of the base plate 10. The first reinforcing ribs 60 and the second reinforcing ribs 70 support the base plate 10 and the sidewalls 20 to strengthen and enhance rigidity of the sidewalls 20 and the base plate 10.

Referring to FIG. 3, in one embodiment, a portion of the sidewalls 20 is recessed toward the cavity 40 to define a first receiving groove 21. In other embodiments, the sidewalls 20 can also be recessed away from the cavity 40 to form the first receiving groove 21. The first receiving groove 21 extends to the base plate 10 and the top plate 30. The first reinforcing ribs 60 are received in the first receiving grooves 21 and abut the base plate 10 and the top plate 30 to strengthen a connection of the sidewalls 20, the base plate 10, and the top plate 30.

Figure 4:
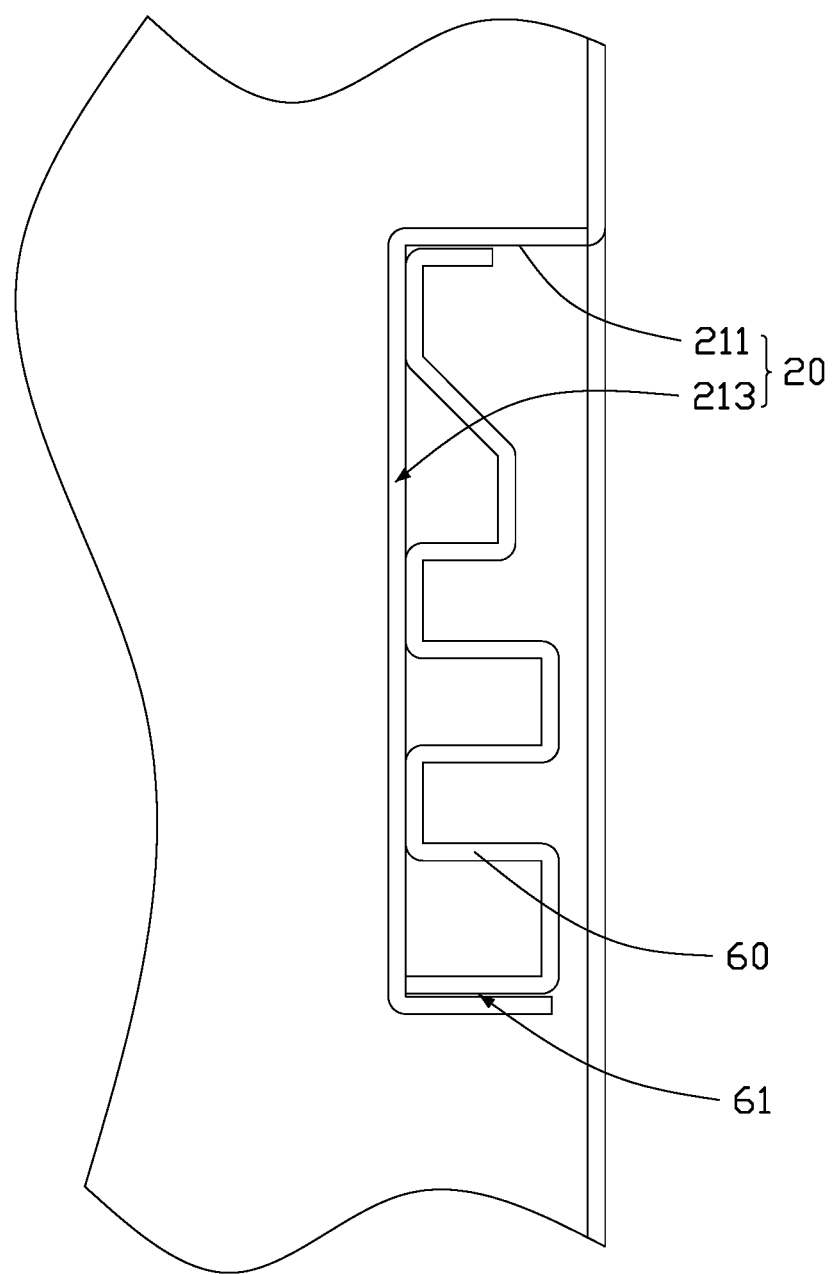
FIG. 4 is a partial view of the server cabinet in FIG. 2 with the top plate removed.

Referring to FIG. 4, the first reinforcing rib 60 is a plate-like structure having a curved cross-section. In one embodiment, the cross-sectional shape of the first reinforcing rib 60 is S-shaped. In other embodiments, the cross-sectional shape of the first reinforcing rib 60 may be M-shaped, U-shaped, or the like.

Referring to FIG. 3 and FIG. 4, the first receiving groove 21 is U-shaped. The first reinforcing rib 60 is welded, screwed, riveted, or bonded to a bottom wall 211 of the first receiving groove 21, so that the first reinforcing rib 60 is fixed to the sidewall 20. In one embodiment, each of two ends of the first reinforcing rib 60 include an abutting portion 61. The two abutting portions 61 abut a groove wall 213 of the first receiving groove 21 to increase lateral and longitudinal support strength of the sidewall 20.

In other embodiments, the two abutting portions 61 may not abut the groove wall 213 of the first receiving groove 21.

In other embodiments, the first reinforcing rib 60 and the sidewall 20 are interference fitted, such that the two abutting portions 61 abut the groove wall 213 of the first receiving groove 21 by tension. Thus, the first reinforcing rib 60 can be quickly mounted to the sidewall 20, which improves assembly efficiency of the server cabinet 100.

In other embodiments, the first reinforcing rib 60 is not coupled to the bottom wall 211 and the top plate 30. Instead, the first reinforcing rib 60 abuts on opposite sides of the first receiving groove 21, which improves strength and rigidity of the sidewall 20.

Referring to FIG. 3, each sidewall 20 is recessed away from the cavity 40 to form a second receiving groove 23. In other embodiments, the sidewalls 20 can be recessed into the cavity 40 to form the second receiving groove 23. The second receiving groove 23 is in communication with the base plate 10. The second reinforcing rib 70 is received in the second receiving groove 23 and coupled to the base plate 10 and the sidewall 20.

The second reinforcing rib 70 includes a first connecting portion 71 and a second connecting portion 73. The first connecting portion 71 and the second connecting portion 73 are coupled together as an L-shape. The first connecting portion 71 is coupled to the base plate 10. The second connecting portion 73 is embedded in the second receiving groove 23 and coupled to the sidewall 20. A plurality of through holes 11 are defined in the base plate 10. The through holes 11 communicate with the second receiving grooves 23. In one embodiment, the first connecting portion 71 is coupled to a side of the base plate 10 facing away from the top plate 30, so as to prevent the first connecting portion 71 from interfering with the electronic components within the cavity 40 and enlarge an available mounting space within the cavity 40. The second connecting portion 73 passes through the corresponding through hole 11 and coupled to the corresponding sidewall 20. In other embodiments, the first connecting portion 71 may also be arranged within the cavity 40, so that the through hole 11 is omitted.

In one embodiment, each of the first receiving grooves 21 receives one first reinforcing rib 60, and each of the second receiving grooves 23 receives one second reinforcing rib 70. In other embodiments, each of the first receiving grooves 21 can receive a plurality of first reinforcing ribs 60, and each of the second receiving grooves 23 can receive a plurality of second reinforcing ribs 70.

In one embodiment, the plurality of through holes 11 are respectively located at the four corners of the base plate 10, and the plurality of second receiving grooves 23 are respectively located above the four corners of the base plate 10. In other embodiments, the plurality of through holes 11 may be located at other positions on the base plate 10 as long as the second reinforcing ribs 70 can pass through the through holes 11 to couple to the base plate 10 and the sidewalls 20. In other embodiments, the second receiving grooves 23 can be located at any position above the base plate 10 as long as the second receiving grooves 23 extend to the base plate 10 to install the second reinforcing ribs 70.

In one embodiment, the first connecting portion 71 and the second connecting portion 73 are perpendicular and are integrally formed. In other embodiments, the first connecting portion 71 and the second connecting portion 73 are coupled together by a fastener, and the first connecting portion 71 and the second connecting portion 73 may be a quadrangular ball structure, a V-shaped block structure, or the like. The second reinforcing ribs 70 is welded, screwed, riveted, or bonded to the sidewalls 20 and the base plate 10.

In other embodiments, the server cabinet 100 may also include a first reinforcing rib 60 or a second reinforcing rib 70 mounted on the sidewalls 20.

The server cabinet 100 includes the first reinforcing ribs 60 and the second reinforcing ribs 70 to couple the sidewalls 20 and the base plate 10, thereby enhancing strength and rigidity of the base plate 10 and the sidewalls 20. Furthermore, only a portion of the sidewalls 20 is recessed to form the receiving grooves 21, 23 to receive the reinforcing ribs 60, 70, thereby minimizing an overall size change of the server cabinet 100 and optimize use of the cavity 40.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A server cabinet comprising:
a base plate;
a plurality of sidewalls;
a top plate; and
a plurality of reinforcing ribs; wherein:
the plurality of sidewalls are arranged surrounding the base plate and coupled between the top plate and the base plate to form a cavity;
a portion of each of the sidewalls defines a plurality of receiving grooves;
each of the plurality of reinforcing ribs is received within one of the plurality of receiving grooves and coupled to at least one of the sidewalls and the base plate.

2. The server cabinet of claim 1, wherein a cross-section of each of the reinforcing ribs is a curved cross-section.

3. The server cabinet of claim 2, wherein:
A cross-section of each of the receiving grooves is a U-shaped cross-section;
each of two ends of each of the reinforcing ribs comprises an abutting portion;
the abutting portion abuts an inner wall of each of the receiving grooves.

4. The server cabinet of claim 2, wherein each of the plurality of reinforcing ribs is coupled to the base plate or to the top plate.

5. The server cabinet of claim 1, wherein:
the plurality of reinforcing ribs are arranged at a junction of the base plate and the sidewalls; and
each of the receiving grooves is coupled to the base plate.

6. The server cabinet of claim 5, wherein:
each of the plurality of reinforcing ribs comprises a first connecting portion and a second connecting portion perpendicularly connected to the first connecting portion;
the first connecting portion is coupled to the base plate;
the second connecting portion is received in the receiving groove and coupled to the corresponding sidewall.

7. The server cabinet of claim 6, wherein:
the base plate defines a plurality of through holes communicating with the receiving groove;
the first connecting portion is coupled to a side of the base plate facing away from the sidewalls; and
the second connecting portion passes through a corresponding one of the through holes and is coupled to a corresponding one of the sidewalls.

8. The server cabinet of claim 6, wherein the first connecting portion and the second connecting portion are integrally formed.

9. The server cabinet of claim 1, wherein the plurality of reinforcing ribs are coupled to the sidewalls and the base plate by welding, screwing, riveting, or adhesion.

10. The server cabinet of claim 1, wherein the plurality of sidewalls are spaced apart between the base plate and the top plate to define a plurality of openings.

* * * * *